(12) United States Patent
Cnudde et al.

(10) Patent No.: US 12,730,685 B1
(45) Date of Patent: Sep. 8, 2026

(54) METHOD AND SYSTEM FOR MANAGING RESOURCE UTILIZATION BASED ON REINFORCEMENT LEARNING

(71) Applicant: YAHOO ASSETS LLC, Dulles, VA (US)

(72) Inventors: Peter Cnudde, Los Altos, CA (US); Jason Lowe, Urbana, IL (US); Nathaniel Roberts, Ogden, IL (US)

(73) Assignee: YAHOO ASSETS LLC, New York, NY (US)

( * ) Notice: Subject to any disclaimer, the term of this patent is extended or adjusted under 35 U.S.C. 154(b) by 586 days.

(21) Appl. No.: 17/992,134

(22) Filed: Nov. 22, 2022

Related U.S. Application Data

(63) Continuation of application No. 15/493,880, filed on Apr. 21, 2017, now Pat. No. 11,513,866.

(51) Int. Cl.

| | |
|---|---|
| ***G06F 9/50*** | (2006.01) |
| ***G06F 9/48*** | (2006.01) |
| ***G06F 30/20*** | (2020.01) |
| ***G06N 20/00*** | (2019.01) |
| ***H04L 67/10*** | (2022.01) |

(52) U.S. Cl.
CPC .......... *G06F 9/5083* (2013.01); *G06F 9/4881* (2013.01); *G06F 9/505* (2013.01); *G06F 9/5077* (2013.01); *G06F 30/20* (2020.01); *G06N 20/00* (2019.01); *H04L 67/10* (2013.01); *G06F 2209/5019* (2013.01); *G06F 2209/503* (2013.01); *G06F 2209/508* (2013.01)

(58) Field of Classification Search
CPC ...... G06F 9/5083; G06F 9/4881; G06F 9/505; G06F 9/5077; G06F 30/20; G06F 2209/5019; G06F 2209/503; G06F 2209/508; G06N 20/00; H04L 67/10
See application file for complete search history.

(56) References Cited

U.S. PATENT DOCUMENTS

| | | | | |
|---|---|---|---|---|
| 8,429,097 | B1 | 4/2013 | Sivasubramanian et al. | |
| 8,468,041 | B1 | 6/2013 | Vengerov | |
| 10,489,215 | B1 * | 11/2019 | Wen | G06F 9/50 |
| 2004/0073764 | A1 | 4/2004 | Andreasson | |
| 2007/0143765 | A1 | 6/2007 | Aridor et al. | |
| 2013/0346614 | A1 | 12/2013 | Baughman et al. | |
| 2014/0223562 | A1 | 8/2014 | Liu | |

(Continued)

OTHER PUBLICATIONS

Hussin et al., "Improving reliability in resource management through adaptive reinforcement learning for distributed systems", J. Parallel Distrib. Comput. 75 (2015), pp. 93-100.

*Primary Examiner* — Sisley N Kim
(74) *Attorney, Agent, or Firm* — Venable LLP

(57) ABSTRACT

The present teaching relates to managing computing resources. In one example, information about resource utilization on a computing node is received from the computing node. Available resource on the computing node is determined based on the information. A model generated in accordance with reinforcement learning based on simulated training data is obtained. An adjusted available resource is generated based on the available resource and the model with respect to the computing node. The adjusted available resource is sent to a scheduler for scheduling one or more jobs to be executed on the computing node based on the adjusted available resource.

20 Claims, 14 Drawing Sheets

(56) References Cited

U.S. PATENT DOCUMENTS

| | | | | |
|---|---|---|---|---|
| 2017/0017521 | A1 | 1/2017 | Gupta et al. | |
| 2017/0192824 | A1 | 7/2017 | Gupta et al. | |
| 2018/0060128 | A1 | 3/2018 | Liu et al. | |
| 2018/0150339 | A1* | 5/2018 | Pan | G06F 9/5027 |
| 2018/0246758 | A1 | 8/2018 | Cardonha et al. | |
| 2018/0255122 | A1* | 9/2018 | Hu | G06F 9/5027 |

* cited by examiner

METHOD AND SYSTEM FOR MANAGING RESOURCE UTILIZATION BASED ON REINFORCEMENT LEARNING

CROSS REFERENCE TO RELATED APPLICATION

The present application is a continuation of U.S. patent application Ser. No. 15/493,880, filed Apr. 21, 2017, the contents of which are hereby incorporated by reference in its entirety.

BACKGROUND

1. Technical Field

The present teaching relates to methods, systems, and programming for distributed computing. Particularly, the present teaching is directed to methods, systems, and programming for managing computing resource utilization based on reinforcement learning.

2. Discussion of Technical Background

Distributed computing platforms, such as Hadoop or other MapReduce-related frameworks, include software that allocates computing tasks across a group, or "cluster," of distributed software components executed by a plurality of computing devices, enabling large workloads (e.g., data sets) to be processed in parallel and more quickly than is generally feasible with a single software instance or a single device. Such distributed computing platforms typically utilize a job scheduler or resource scheduler to assign jobs to different nodes in the cluster based on resource utilization on the nodes. A goal of the job scheduling is to optimize resource utilization on the nodes.

Current techniques about managing resource utilization on the nodes are based on "overcommit" the resources (e.g. memory, CPU) of the nodes: i.e. the nodes pretend to be larger than they really are. This may compensate for users asking more than they need as well as the variance of the resource needs over the duration of the job. But existing works only apply simple heuristics methods to manage resources on a node, e.g. making the node bigger when the utilization is low and making the node smaller when the utilization is high. This heuristics based method requires manual setting of many parameters across the entire cluster. This is very complicated and time consuming, because different nodes may behaves differently and have different sizes, and because different jobs may have different resource utilization requirements. In addition, existing methods only make use of current resource utilization on the nodes, without considering past resource utilization history, the type of jobs to be assigned, etc.

Therefore, there is a need to develop techniques for managing computing resource utilization to overcome the above drawbacks.

SUMMARY

The present teaching relates to methods, systems, and programming for distributed computing. Particularly, the present teaching is directed to methods, systems, and programming for managing computing resource utilization based on reinforcement learning.

In one example, a method, implemented on a machine having at least one processor, storage, and a communication platform capable of connecting to a network for managing computing resources, is disclosed. Information about resource utilization on a computing node is received from the computing node. Available resource on the computing node is determined based on the information. A model generated in accordance with reinforcement learning based on simulated training data is obtained. An adjusted available resource is generated based on the available resource and the model with respect to the computing node. The adjusted available resource is sent to a scheduler for scheduling one or more jobs to be executed on the computing node based on the adjusted available resource.

In another example, a system having at least one processor, storage, and a communication platform connected to a network for managing computing resources is disclosed. The system comprises: a report analyzer configured for: receiving, from a computing node, information about resource utilization on the computing node, and determining available resource on the computing node based on the information; and a node resource availability adjuster configured for: obtaining a model generated in accordance with reinforcement learning based on simulated training data, generating, based on the available resource and the model, an adjusted available resource with respect to the computing node, and sending the adjusted available resource to a scheduler for scheduling one or more jobs to be executed on the computing node based on the adjusted available resource.

Other concepts relate to software for implementing the present teaching on managing computing resources. A software product, in accord with this concept, includes at least one machine-readable non-transitory medium and information carried by the medium. The information carried by the medium may be executable program code data, parameters in association with the executable program code, and/or information related to a user, a request, content, or information related to a social group, etc.

In one example, a machine-readable, non-transitory and tangible medium having data recorded thereon for managing computing resources is disclosed. The medium, when read by the machine, causes the machine to perform the following: receiving, from a computing node, information about resource utilization on the computing node; determining available resource on the computing node based on the information; obtaining a model generated in accordance with reinforcement learning based on simulated training data; generating, based on the available resource and the model, an adjusted available resource with respect to the computing node; and sending the adjusted available resource to a scheduler for scheduling one or more jobs to be executed on the computing node based on the adjusted available resource.

Additional novel features will be set forth in part in the description which follows, and in part will become apparent to those skilled in the art upon examination of the following and the accompanying drawings or may be learned by production or operation of the examples. The novel features of the present teachings may be realized and attained by practice or use of various aspects of the methodologies, instrumentalities and combinations set forth in the detailed examples discussed below.

BRIEF DESCRIPTION OF THE DRAWINGS

The methods, systems, and/or programming described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
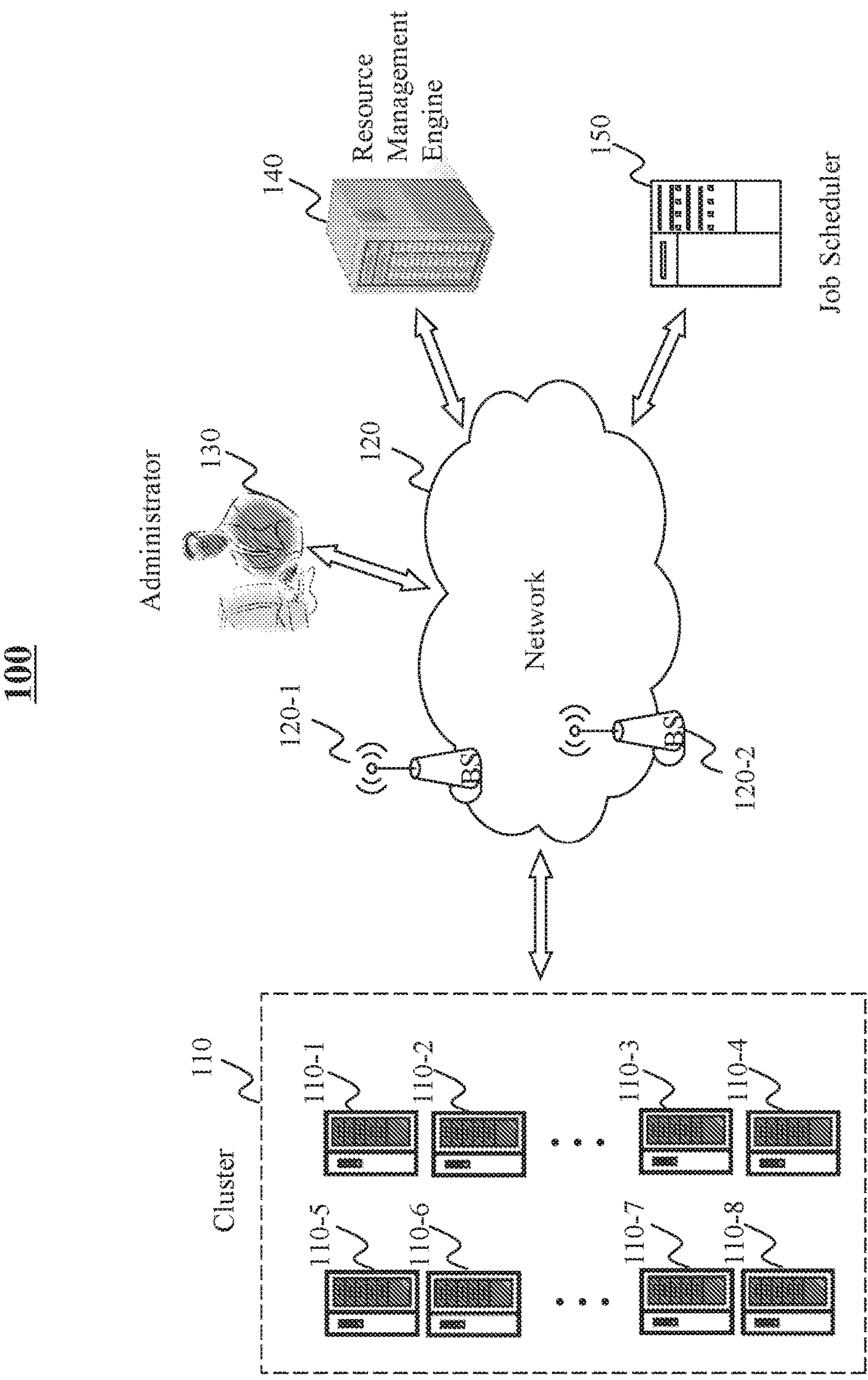
FIG. 1 is a high level depiction of an exemplary networked environment for managing computing resource utilization based on reinforcement learning, according to an embodiment of the present teaching.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, systems, components, and/or circuitry have been described at a relatively high-level, without detail, in order to avoid unnecessarily obscuring aspects of the present teachings.

The present disclosure describes method, system, and programming aspects of managing computing resource utilization based on reinforcement learning. The method and system as disclosed herein aim at optimizing resource utilization on computing nodes in a cluster.

After a job scheduler assigns a job to a node in the cluster for execution, the node reserves a container in its resource for executing the job based on the job assignment. But this job may often not occupy the entire container, thus causing a waste of resource on the node. When the node reports its available resource to a scheduler after excluding all of the containers open on the node, the scheduler may not assign a job to the node because the reported available resource is not enough. But the node may actually have enough resource to run the job because current running jobs on the node do not occupy all of the open containers on the node. For example, the node may have a total of 40G space among which some jobs are running on 3 containers each having 10G, but actually only half (5G) of each container is being used. If the node reports 10G availability to the scheduler, the scheduler cannot assign a job costing 20G to the node, although the node does have more than 20G (25G) space to run this job. In this case, the node may overcommit by reporting availability larger than 10G. On one hand, if a node is too aggressive by overcommitting a lot, the node may be assigned a job that it cannot handle, e.g. due to an increase of resource utilization by current running jobs. Then, the node needs to stop or hold one or more jobs, causing job lost on the node. On the other hand, if a node is too conservative by overcommitting a little or no overcommitting, the node may waste many resources and have low resource utilization.

The present teaching utilizes an Artificial Intelligent (AI) agent to manage resources on a node to optimize resource utilization on the node without causing many jobs lost. According to various embodiments of the present teaching, the disclosed system can use various machine learning approaches, in particular reinforcement learning and neuroevolution to learn or train this agent based on actual historic resource utilization. The system does not need many manual setting of parameters. The system can make use of current resource utilization on the nodes, as well as past resource utilization history, the type of jobs to be assigned, node information, contextual information, and job priority information, to train the agent.

Having an AI agent managing resources on nodes in a cluster may increase utilization and lower cost significantly. The AI agent can perform much better than any human programmed agent as it can detect the patterns in the jobs and use these patterns of resource utilization to optimally control each node.

In one embodiment, the system uses variants of reinforcement learning to train the AI agent that will decide how much to adjust resource availability on each node of a cluster at each moment in time. Different from classical machine learning, reinforcement learning algorithms do not need knowledge about Markov decision process for formulating an environment and they target large Markov decision processes where exact methods become infeasible. Reinforcement learning also differs from standard supervised learning in that correct input/output pairs are not presented, nor sub-optimal actions explicitly corrected. Reinforcement learning uses samples to optimize performance and uses function approximation to deal with large environments. Reinforcement learning can be applied when a simulation model of the environment is given, but an analytic solution is not available, and the only way to collect information about the environment is by interacting with it.

The present teaching utilizes reinforcement learning to train a resource management engine/agent based on actual jobs, e.g. Hadoop jobs. This agent can detect and react to patterns that would be impossible for human programmed agents.

In one embodiment, during the training of the resource management engine, a resource management engine simulator serves as a simulated agent and is configured for simulating the resource management engine to interact with a job scheduler simulator that serves as a simulated environment, based on both actual and simulated job assignment historic data. There is no need of a supervisor during the training/learning. The job scheduler simulator can provide a reward score and an observation (related to job assignment) to the resource management engine simulator in response to any action (related to resource commit or adjustment) taken by the resource management engine simulator. The resource management engine simulator will provide a next action (related to resource commit or adjustment) based on the reward score and the observation provided by the job scheduler simulator. Therefore, an action of the simulated agent can affect the subsequent data the simulated agent receives. This simulation goes on until the reward score reaches its target, or another predetermined condition is met. The resource management engine can then use the model generated by the resource management engine simulator based on the simulation to manage resources.

In addition to the simulations, the system can also select input parameters, output parameters, a right fitness function, and a proper learning algorithm to speed up learning. For example, the system may try multiple learning algorithms at the same time by running them all through the simulator. The system may then score them and pick the best ones, e.g. the ten best algorithms. From the ten best algorithms, the system can propagate more similar algorithms to be run again through the simulator. The process repeats until a good learning algorithm is selected. In one example, a genetic algorithm like Neuro-Evolution of Augmenting Topologies (NEAT) may be selected as the learning algorithm.

The terms "node", "operation node" and "computing node" may be used interchangeably herein. The terms "scheduler" and "job scheduler" may be used interchangeably herein.

Additional novel features will be set forth in part in the description which follows, and in part will become apparent to those skilled in the art upon examination of the following and the accompanying drawings or may be learned by production or operation of the examples. The novel features of the present teachings may be realized and attained by practice or use of various aspects of the methodologies, instrumentalities and combinations set forth in the detailed examples discussed below.

FIG. 1 is a high level depiction of an exemplary networked environment 100 for managing computing resource utilization based on reinforcement learning, according to an embodiment of the present teaching. In FIG. 1, the exemplary networked environment 100 includes an administrator 130, a cluster 110, a network 120, a resource management engine 140, and a job scheduler 150. In this exemplary networked environment 100, the administrator 130 may send a request to run one or more jobs in the cluster 110 via the network 120 or via an internal or proprietary network connection (not shown). In one embodiment, the administrator 130 may send an instruction to determine one or more model configurations for a machine learning based model, where the model may be used for resource adjustment and utilization optimization.

The network 120 may be a single network or a combination of different networks. For example, the network 120 may be a local area network (LAN), a wide area network (WAN), a public network, a private network, a proprietary network, a Public Telephone Switched Network (PSTN), the Internet, a wireless network, a virtual network, or any combination thereof. The network 120 may also include various network access points, e.g., wired or wireless access points such as base stations or Internet exchange points 120-1, . . . , 120-2, through which a data source may connect to the network in order to transmit information via the network.

The cluster 110 in which the job is performed includes a plurality of operation nodes 110-1, 110-2, . . . 110-7, 110-8, which can communicate with the resource management engine 140 and/or the job scheduler 150 through the network 120. In one embodiment, the cluster also includes at least one coordination node, e.g., a gateway node in a Hadoop cluster.

In this example, each node of the cluster 110 may be an autonomous physical machine, such as a server, a workstation, a desktop or laptop computer, a netbook, a tablet, a smart phone, a game console, a set-top box, or any other suitable machine. In another example, some or all of the nodes may be parallel virtual machines implemented by either software emulation or hardware virtualization. The cluster 110 may be a set of machines owned by one entity, e.g., an enterprise, and maintained as a server farm or server cluster where the servers are mounted on racks in a server room or data center. The cluster 110 may also be a collection of machines owned by different entities and that are physically separate from each other at a distance.

Each node of the cluster 110 may report information about its resource utilization to the resource management engine 140. The information may include information about running jobs on the computing node, information about reserved containers on the computing node, and information about available resources on the computing node. Resource herein may refer to computing resources like CPU, memory, storage, etc. of a node.

The resource management engine 140 may receive the report from the node and determine available resource on the computing node based on the report. Then based on a model generated in accordance with reinforcement learning based on simulated training data, the resource management engine 140 may adjust the available resource with respect to the computing node and send the adjusted available resource to the job scheduler 150 for scheduling one or more jobs to be executed on the computing node based on the adjusted available resource. In one example, after determining a 10G available resource on the node, the resource management engine 140 may adjust a 15G available resource for the node, based on the model, which is trained or learned using reinforcement learning.

In this example, the job scheduler 150 may receive information, e.g. a number, representing an adjusted available resource for a node, without knowing that this number has been adjusted by the resource management engine 140 and is different than the available resource originally reported by the node. Without knowing the details of work performed by the resource management engine 140 or even without knowing the resource management engine 140 exists, the job scheduler 150 can assign one or more jobs to the node in the cluster 110, based on the adjusted available resource sent by the resource management engine 140, treating the adjusted available resource as an accurate indication of available resource on the node.

Figure 2:
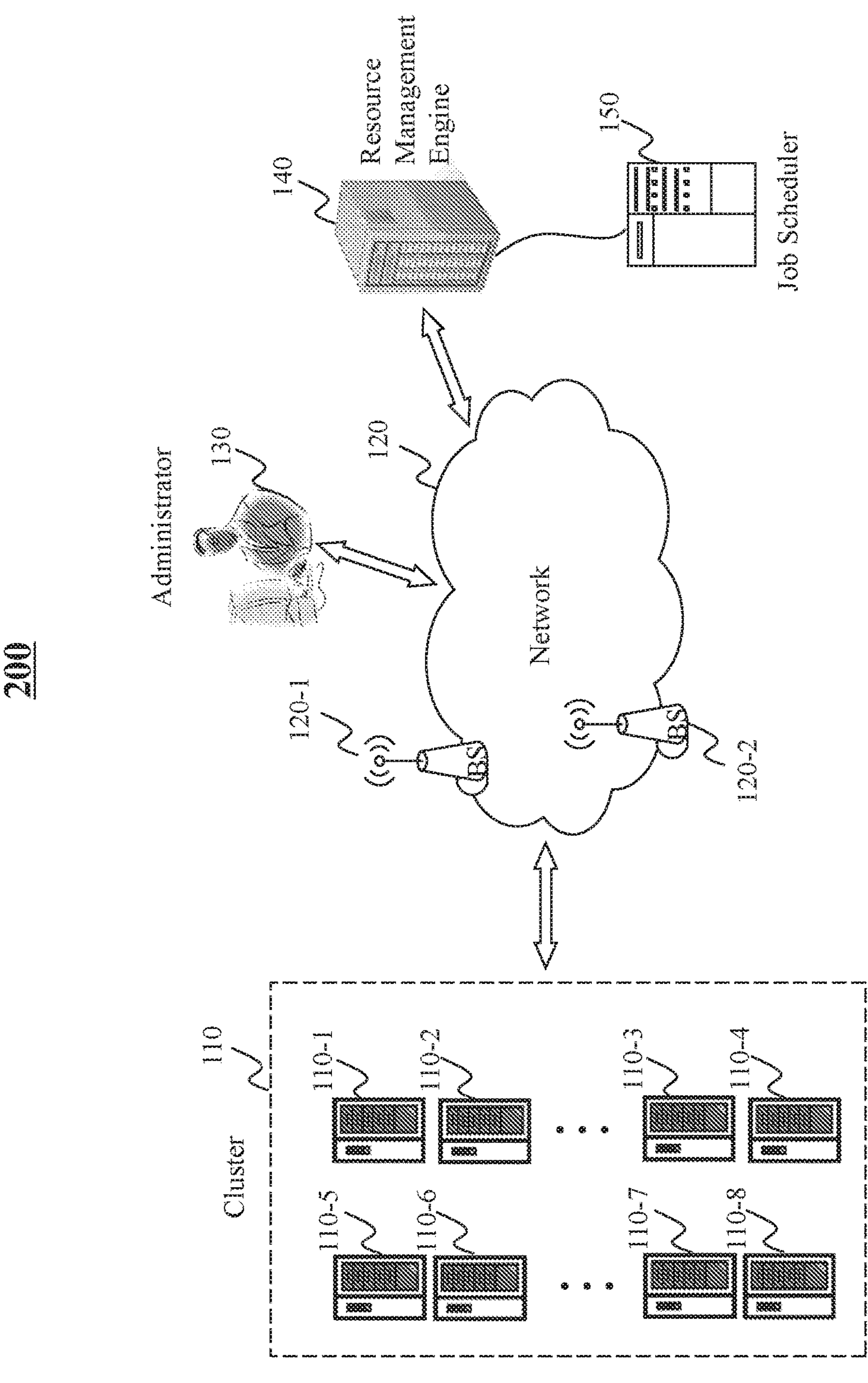
FIG. 2 is a high level depiction of another exemplary networked environment for managing computing resource utilization based on reinforcement learning, according to an embodiment of the present teaching.

FIG. 2 is a high level depiction of another exemplary networked environment 200 for managing computing resource utilization based on reinforcement learning, according to an embodiment of the present teaching. The exemplary networked environment 200 in this embodiment is similar to the exemplary networked environment 100 in FIG. 1, except that the job scheduler 150 may serve as a backend system of the resource management engine 140.

Figure 3:
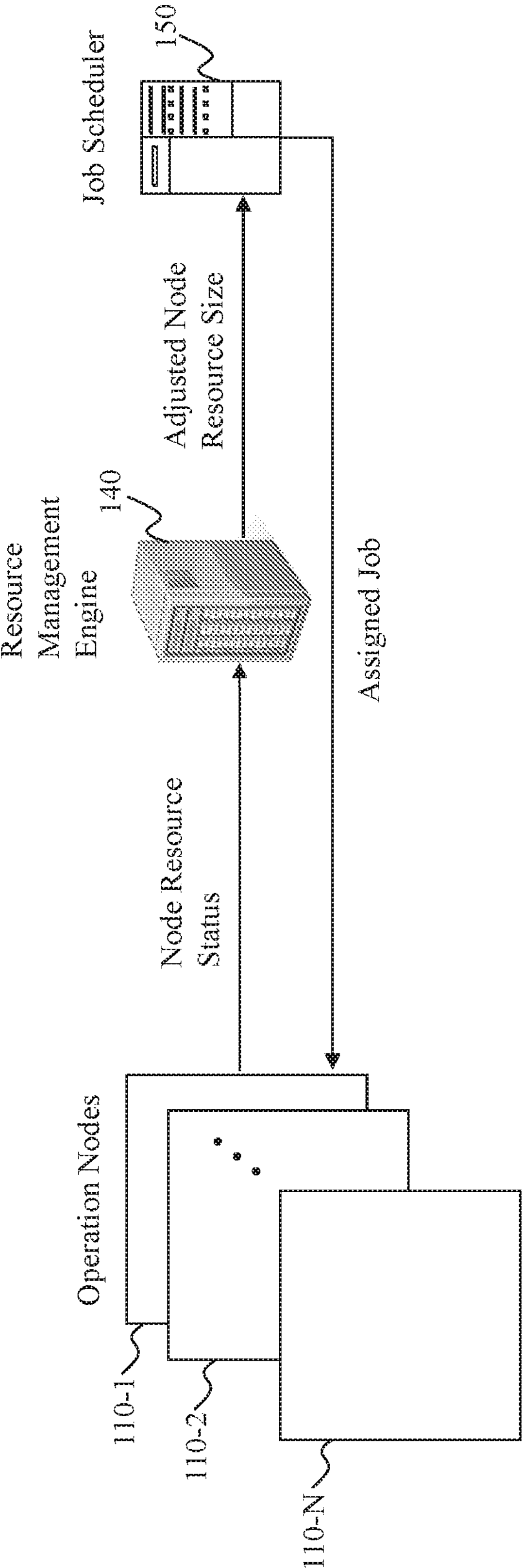
FIG. 3 illustrates an exemplary process of managing computing resource utilization, according to an embodiment of the present teaching.

FIG. 3 illustrates an exemplary process of managing computing resource utilization, according to an embodiment of the present teaching. As shown in FIG. 3, any operation node, e.g. 110-1, may send information about node resource status to the resource management engine 140. The node resource status may include information about running jobs on the node, information about reserved containers on the node, and information about available resources on the node. Based on the resource status, the resource management engine 140 may determine a node resource size, e.g. 10G, of the node. Then according to a model generated based on reinforcement learning, the resource management engine 140 may calculate an adjusted node resource size, e.g. 15G or 20G, and send the adjusted node resource size to the job scheduler 150. The job scheduler 150 may schedule one or more job to the node based on the adjusted node resource size, believing that the adjusted node resource size reflects an accurate indication of available resource on the node.

Figure 4:
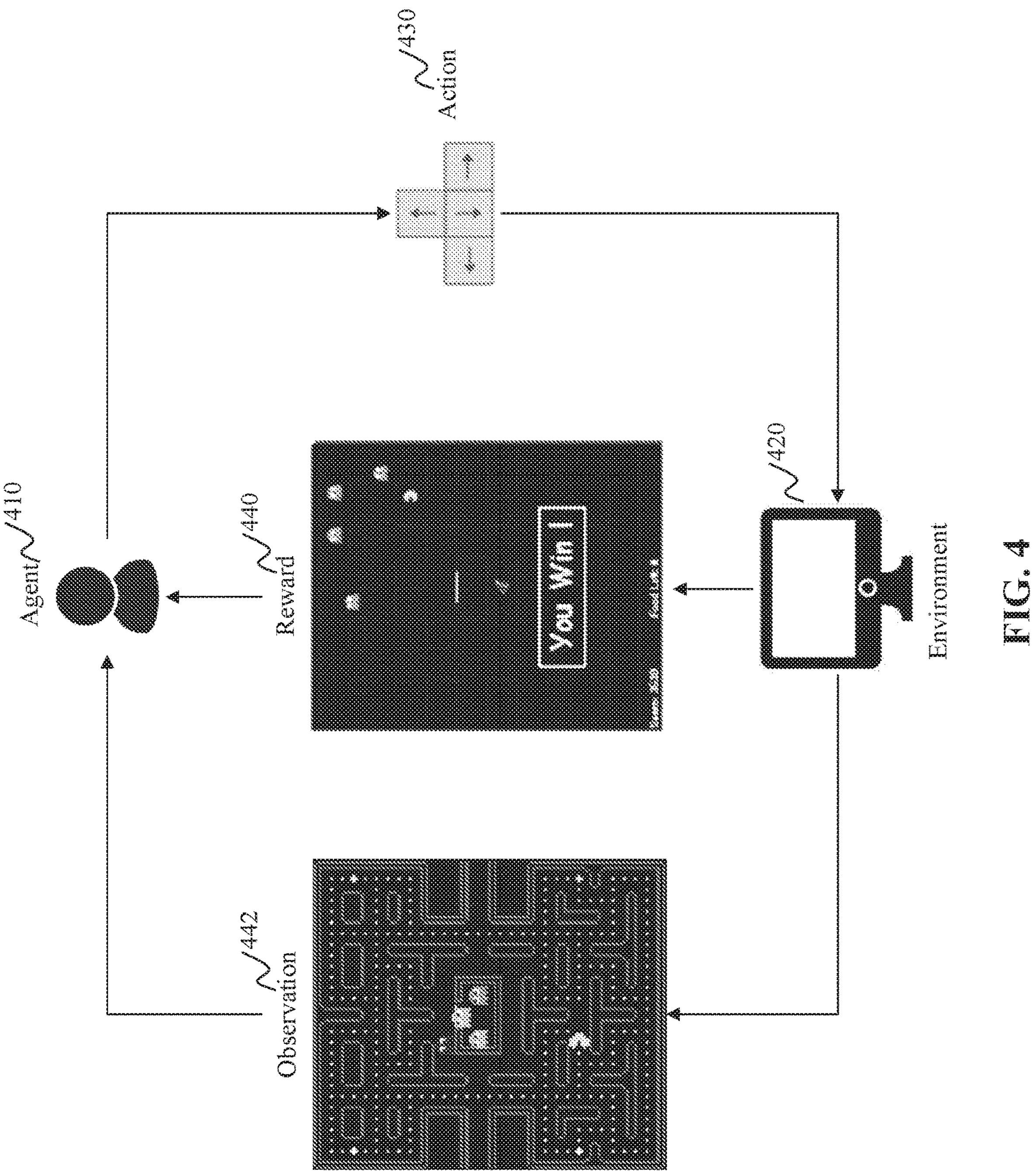
FIG. 4 illustrates an exemplary process of reinforcement learning, according to an embodiment of the present teaching.

FIG. 4 illustrates an exemplary process of reinforcement learning, according to an embodiment of the present teaching. In general, a reinforcement learning problem can be a straightforward framing of the problem of learning from interaction to achieve a goal. The learner or decision-maker is called the agent 410. The thing it interacts with, comprising everything outside the agent, is called the environment 420. During the reinforcement learning, the agent 410 and the environment 420 interact continually, while the agent 410 selects actions 430 and the environment 420 responds to those actions and presents new situations or observations 442 to the agent 410. The environment 420 also provides rewards 440 to the agent 410 based on those actions. The rewards may be special numerical values that the agent 410 tries to maximize over time. A complete specification of an environment may define a task, one instance of the reinforcement learning problem.

More specifically, the agent 410 and environment 420 interact at each of a sequence of discrete time steps. At each time step, the agent 410 receives some representation of the environment 420's state, i.e. an observation 442, and on that basis selects an action 430. One time step later, in part as a consequence of its action, the agent 410 receives a numerical reward, and finds itself in a new state. At each time step, the agent 410 implements a mapping from states to probabilities of selecting each possible action. This mapping is called the agent 410's policy or model. Reinforcement learning methods can specify how the agent 410 changes its model as a result of its experience. The agent 410's goal, roughly speaking, may be to maximize the total amount of reward it receives over the long run.

In one example, as shown in FIG. 4, reinforcement learning method can be used to train a model for an agent 410 to play the game Pac-Man. In this case, the agent 410 may be a simulated player and the environment 420 may represent a simulated computer running the Pac-Man game. At each time step, the action 430 may include a direction instruction from the agent 410; and the observation 442 may include a change of the game status. Please note the game status, like locations of the Pac-Man, locations of the enemies, and number of dots left, will change according to the direction instruction given by the agent 410. The rewards 440 in this example may be represented by the scores achieved by the agent 410 and/or the final result of the game. Aiming at maximizing the achieved scores and winning the game, the agent 410 can develop a good model/policy to handle different situations of the game.

In another example, one can apply the reinforcement learning method to train a model for the resource management engine 140 to calculate an adjusted node resource size for a node. In this case, the agent 410 may be a simulated resource management engine and the environment 420 may represent a simulated job scheduler. At each time step, the action 430 may include an adjusted resource size reported to the simulated job scheduler and the observation 442 may include job assignment to the node based on the last reported adjusted resource size by the agent 410. The reward 440 in this example may be represented by a score calculated, e.g. based on a fitness function whose value is proportional to a resource utilization rate on the node and is inversely proportional to a number of jobs lost on the node due to short of resource. Aiming at maximizing the obtained scores, the agent 410 can develop a good model to generate adjusted node resource sizes to optimize resource utilization on the node while minimizing cost due to jobs lost.

Figure 5:
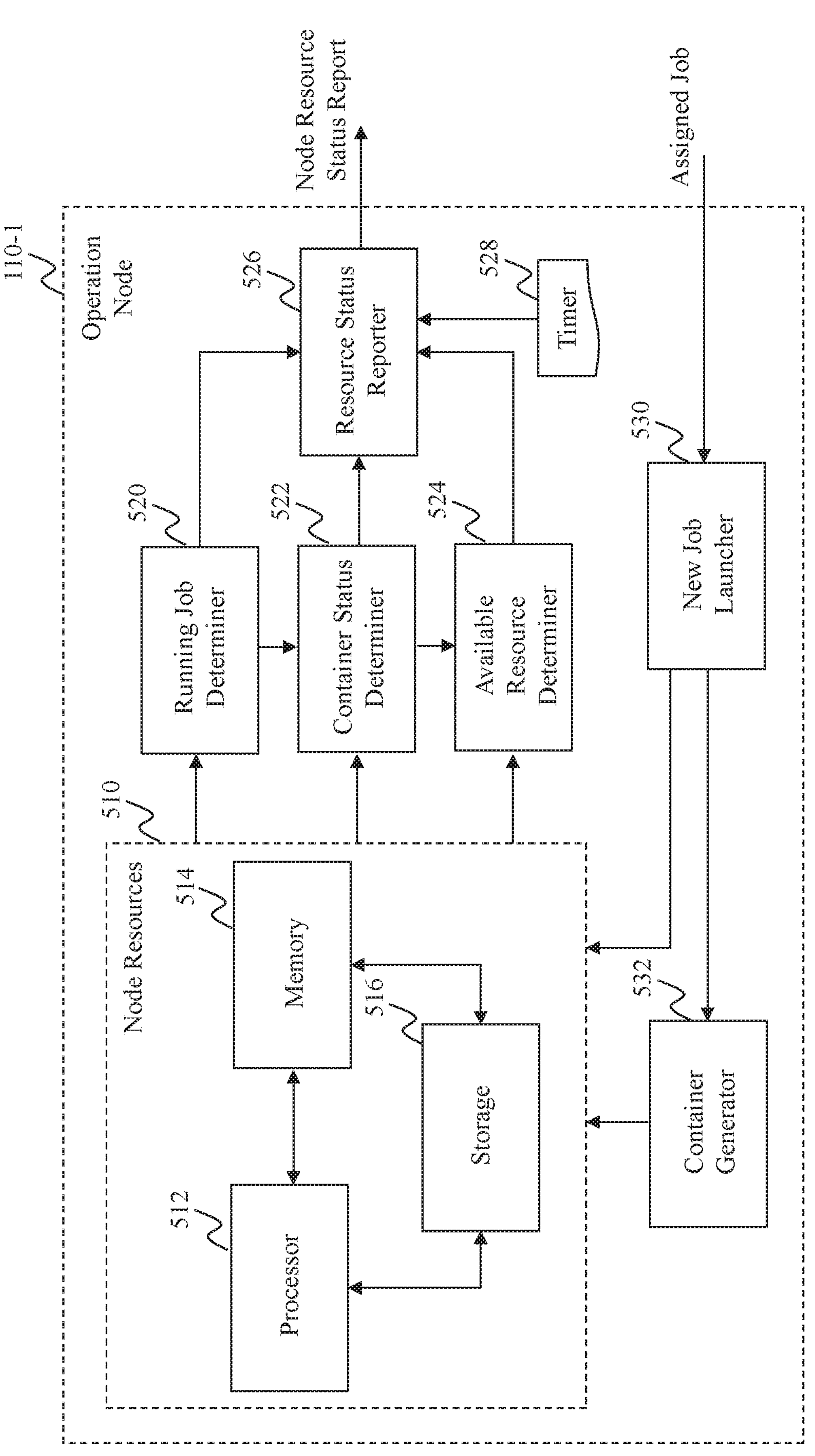
FIG. 5 illustrates an exemplary diagram of an operation node, according to an embodiment of the present teaching.

FIG. 5 illustrates an exemplary diagram of an operation node 110-1, according to an embodiment of the present teaching. It can be understood that the diagram shown in FIG. 5 may apply to any operation node in the cluster 110. As shown in FIG. 5, the operation node 110-1 in this example includes node resources 510, a running job determiner 520, a container status determiner 522, an available resource determiner 524, a resource status reporter 526, a timer 528, a new job launcher 530, and a container generator 532.

The node resources 510 in this example include computing resources like processor 512, memory 514, storage 516 of the node 110-1. The node 110-1 can run assigned jobs with these node resources 510.

The running job determiner 520 in this example may determine information related to running jobs on the node, based on the node resources 510. For example, the information related to running jobs may include information about: number of running jobs on the node, estimated finishing time for each running job, a priority level for each running job, contextual information related to each running job, etc. The running job determiner 520 may send the information related to running jobs to the container status determiner 522 for determining container status information and to the resource status reporter 526 for generating a resource status report.

The container status determiner 522 in this example may receive the information related to running jobs from the running job determiner 520 and determine container status information with respect to the node resources 510 based on the information related to running jobs. A container may be a reserved space in the node resources 510 for running a corresponding job. The container status information determined at the container status determiner 522 may include: number of containers on the node, relationships between each container and a corresponding running job, a size of each container, usage information of each container, etc. The usage information of each container may further include: maximum usage of the container, minimum usage of the container, average usage of the container, and current usage of the container. For example, for a container opened for a job, the container may have a total size of 10G, while the job is currently using 5G of the container, the job may have used at least 2G, but no more than 6G of the container; and the job may have used on average 4G of the container. The container status determiner 522 may send the container status information to the available resource determiner 524 for determining available resource information and to the resource status reporter 526 for generating a resource status report.

The available resource determiner 524 in this example may receive the container status information from the container status determiner 522 and determine available resource information on the node based on the container status information. The available resource determiner 524 may calculate a size of available resources on the node based on the total size of node resources 510 and the container status information. In addition to the size of available resources on the node, the available resource information may also include information about: past history of sizes of available resources on the node, past performance of the node with the size of available resource, and past history about jobs lost on the node, etc. The available resource determiner 524 may send the available resource information to the resource status reporter 526 for generating a resource status report.

The resource status reporter 526 in this example may receive information related to running jobs from the running job determiner 520, the container status information from the container status determiner 522, and the available resource information from the available resource determiner 524. The resource status reporter 526 in this example may generate a resource status report according to the timer 528 or upon a request, based on the above received information. For example, the resource status reporter 526 may periodically generate a resource status report to include all of the information received from the running job determiner 520, the container status determiner 522, and the available resource determiner 524. The resource status reporter 526 can send the report to the resource management engine 140 for resource optimization/adjustment.

The new job launcher 530 in this example may receive an assigned job to be launched on the node. The job may be assigned by the job scheduler 150 based on an adjusted available resource that is generated by the resource management engine 140 based on the report from the resource status reporter 526 to the resource management engine 140. The new job launcher 530 may launch a new job based on the job assignment. The new job launcher 530 may instruct the container generator 532 to generate a container for running the new job.

The container generator 532 in this example may generate a new container, e.g. by reserving a new space in the node resources 510, for running the new job launched by the new job launcher 530. Accordingly, the resource status information to be collected by the running job determiner 520, the container status determiner 522, and the available resource determiner 524 will change in next round. In one example, the running job determiner 520, the container status determiner 522, and the available resource determiner 524 may continuously collect resource status information from the node resources 510 and send to the resource status reporter 526 for generating the resource status report. In another example, the running job determiner 520, the container status determiner 522, and the available resource determiner 524 may periodically collect resource status information from the node resources 510 and send to the resource status reporter 526 for generating the resource status report, e.g. for every minute, every hour, or every day.

Figure 6:
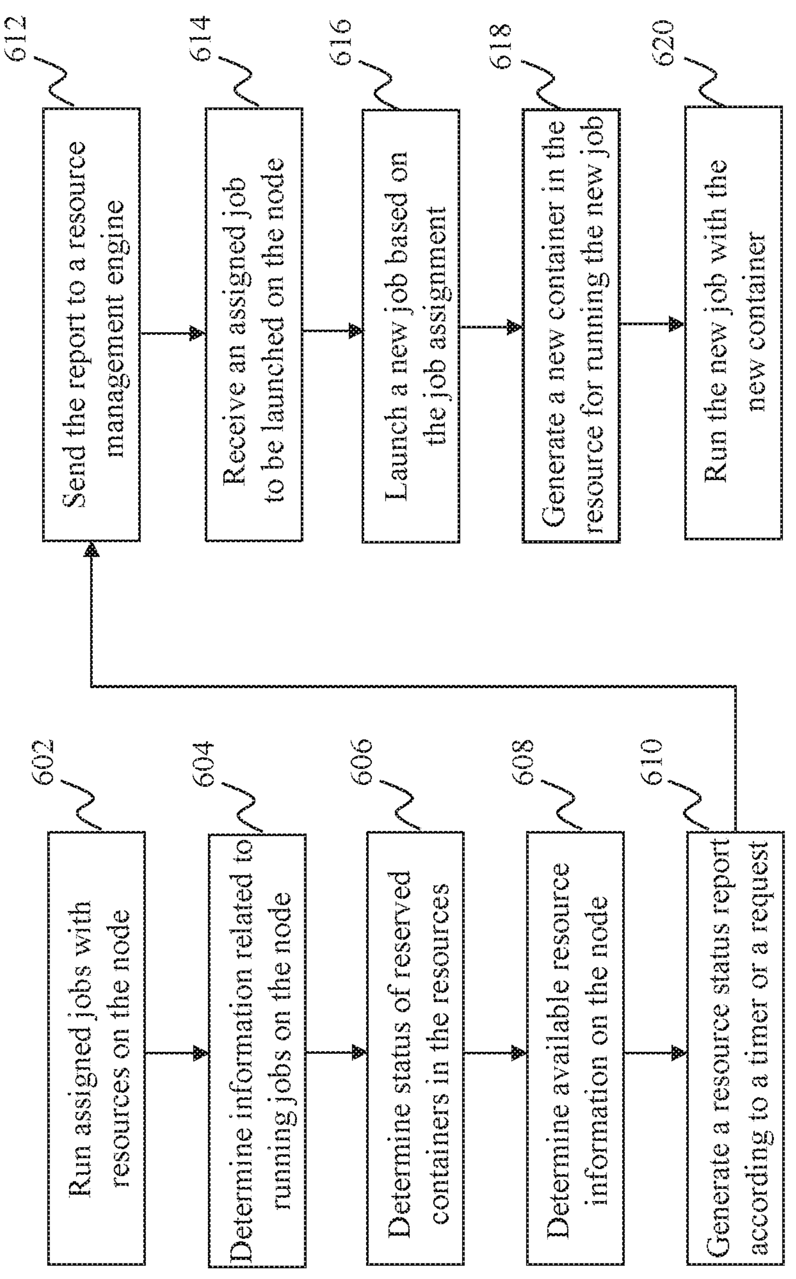
FIG. 6 is a flowchart of an exemplary process performed by an operation node, according to an embodiment of the present teaching.

FIG. 6 is a flowchart of an exemplary process performed by an operation node, e.g. the operation node 110-1 in FIG. 5, according to an embodiment of the present teaching. Assigned jobs are run at 602 with resources on the node. Information related to running jobs on the node is determined at 604. At 606, information about status of reserved containers in the resources is determined. At 608, available resource information on the node is determined. A resource status report is generated at 610 according to a timer or a request. The report is sent at 612 to a resource management engine.

An assigned job is received at 614 to be launched on the node. A new job is launched at 616 based on the job assignment. A new container is generated at 618 in the resource for running the new job. The new job is run at 620 with the new container.

Figure 7:
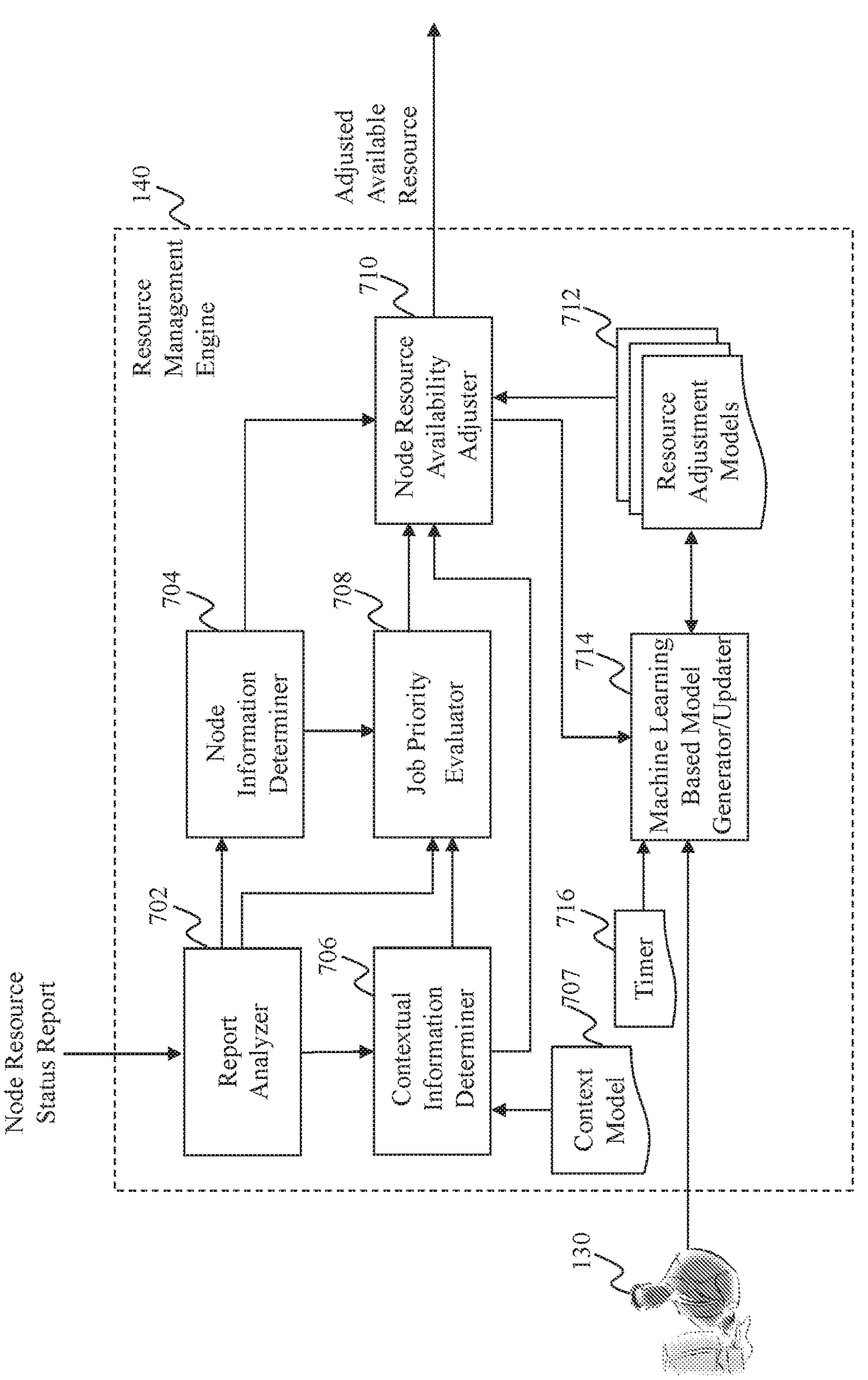
FIG. 7 illustrates an exemplary diagram of a resource management engine, according to an embodiment of the present teaching.

FIG. 7 illustrates an exemplary diagram of a resource management engine 140, according to an embodiment of the present teaching. As shown in FIG. 7, the resource management engine 140 in this example includes a report analyzer 702, a node information determiner 704, a contextual information determiner 706, a context model 707, a job priority evaluator 708, a node resource availability adjuster 710, one or more stored resource adjustment models 712, a machine learning based model generator/updater 714, and a timer 716.

The report analyzer 702 in this example may receive a node resource status report from a node in the cluster. The report analyzer 702 may analyze the report to extract information from the report. The report analyzer 702 can then forward the analyzed report to the node information determiner 704 for determining node information, to the contextual information determiner 706 for determining contextual information, and to the job priority evaluator 708 for evaluating job priorities.

The node information determiner 704 in this example may receive the analyzed report from the report analyzer 702 and determine node information of the node itself. The node information may include information about the node's hardware and software, e.g. brand, model and specification of its CPU, memory, storage, etc. The node information determiner 704 may then send the node information of the node itself to the job priority evaluator 708 for evaluating job priorities and to the node resource availability adjuster 710 for determining an adjusted available resource size.

The contextual information determiner 706 in this example may receive the analyzed report from the report analyzer 702 and determine contextual information based on the report. The contextual information may be determined based on the context model 707. In one embodiment, the contextual information may include information about: time and day when each running job was launched, and the types of the running jobs on the node. For example, engineers may tend to run shorter jobs that are more interactive during the daytime, and may tend to launch large jobs that will run overnight. In another example, engineers may tend to run shorter jobs that are more interactive during weekdays, and may tend to launch large jobs that will run over an entire weekend at the end of each week. The contextual information determiner 706 may then send the contextual information to the job priority evaluator 708 for evaluating job priorities and to the node resource availability adjuster 710 for determining an adjusted available resource size.

The job priority evaluator 708 in this example may receive the analyzed report from the report analyzer 702, the node information of the node itself from the node information determiner 704, and the contextual information from the contextual information determiner 706. The job priority evaluator 708 can evaluate a degree of priority for each running job on the node, based on the received information. For example, the job priority evaluator 708 may determine a degree of priority for a running job based on its type, date and time when it started to run, and other contextual information. The job priority evaluator 708 may also determine a degree of priority for a running job based on its container status and information about the requester who requested this job. In addition, the job priority evaluator 708 can evaluate a degree of priority for each running job based on its relative relationship with other running jobs on the node and/or jobs running on other nodes. The job priority evaluator 708 may also evaluate a degree of priority for a potential job that may be executed on the node in the future. The job priority evaluator 708 may then send the information about job priority to the node resource availability adjuster 710 for determining an adjusted available resource size.

The node resource availability adjuster 710 in this example may receive the node information of the node itself from the node information determiner 704, the contextual information from the contextual information determiner 706, and the information about job priority from the job priority evaluator 708. The node resource availability adjuster 710 may select one of the resource adjustment models 712, and determine an adjusted available resource size according to the selected model, based on the received information from the node information determiner 704, the contextual information determiner 706, and the job priority evaluator 708. According to various embodiments, the node resource availability adjuster 710 may obtain the available resource reported by the node, via the node information determiner 704, the contextual information determiner 706, the job priority evaluator 708, or directly from the report analyzer 702. According to the selected model, the node resource availability adjuster 710 may adjust the available resource to optimize resource utilization on the node. The node resource availability adjuster 710 may send the adjusted available resource size to the job scheduler 150 for scheduling one or more jobs to be executed on the node based on the adjusted available resource size. In addition, the node resource availability adjuster 710 may record the node resource adjustment information and send it to the machine learning based model generator/updater 714 for training or updating the stored resource adjustment models 712.

The machine learning based model generator/updater 714 in this example may generate or update the stored resource adjustment models 712 based on an instruction from the administrator 130 or the timer 716. For example, the machine learning based model generator/updater 714 may update the stored resource adjustment models 712 periodically, e.g. every minute, every hour, or every day. The machine learning based model generator/updater 714 may also update one or more of the stored resource adjustment models 712 upon receiving an instruction from the administrator 130. The instruction may also indicate how to update the model, e.g. to be more aggressive or more conservative. In general, the machine learning based model generator/updater 714 may use any machine learning method to train or update the stored resource adjustment models 712. In particular, the machine learning based model generator/updater 714 can use a reinforcement learning method to train or update the stored resource adjustment models 712 based on simulations.

Figure 8:
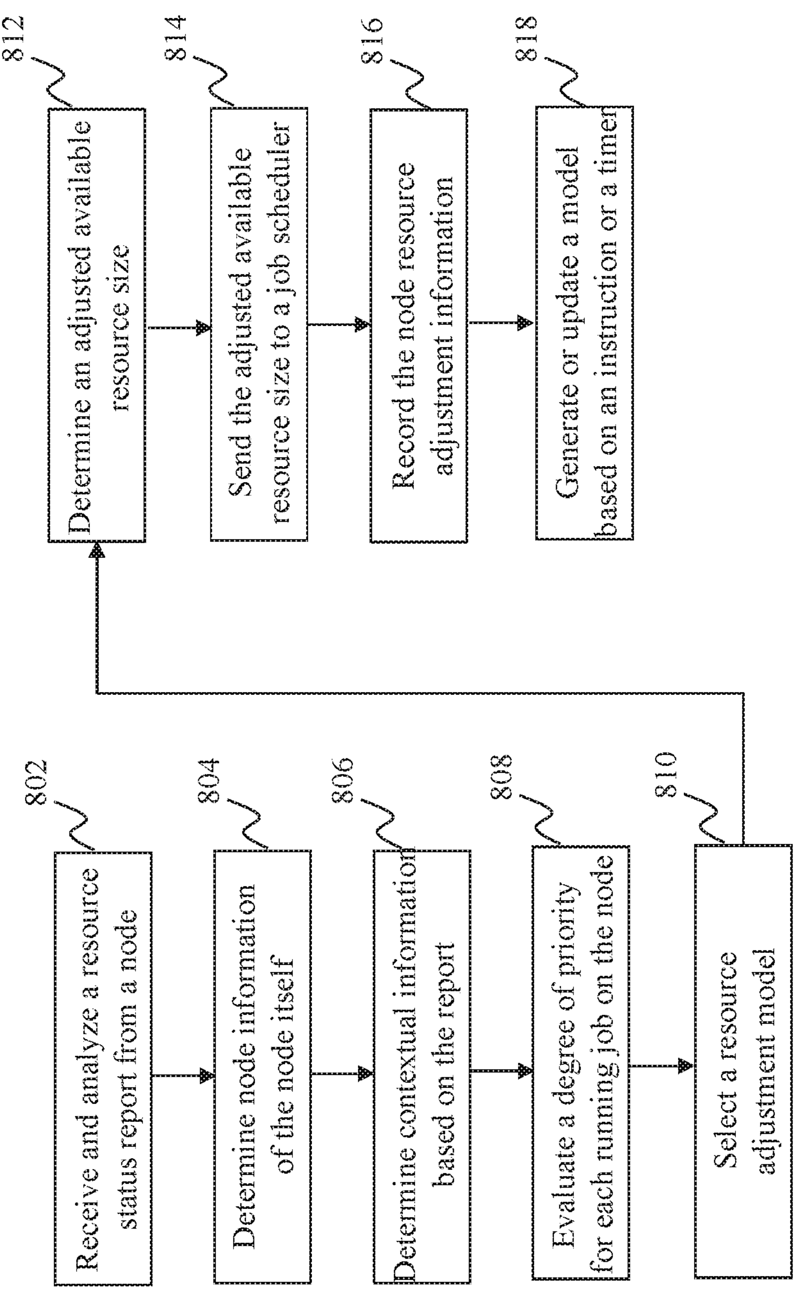
FIG. 8 is a flowchart of an exemplary process performed by a resource management engine, according to an embodiment of the present teaching.

FIG. 8 is a flowchart of an exemplary process performed by a resource management engine, e.g. the resource management engine 140 in FIG. 7, according to an embodiment of the present teaching. At 802, a resource status report is received from a node and analyzed. Node information of the node itself may be determined at 804. Contextual information is determined at 806 based on the report. A degree of priority is evaluated at 808 for each running job on the node.

A resource adjustment model is selected at 810. An adjusted available resource size is determined at 812. The adjusted available resource size is sent at 814 to a job scheduler. The node resource adjustment information is recorded at 816. At 818, one or more resource adjustment models are generated or updated based on an instruction or a timer.

Figure 9:
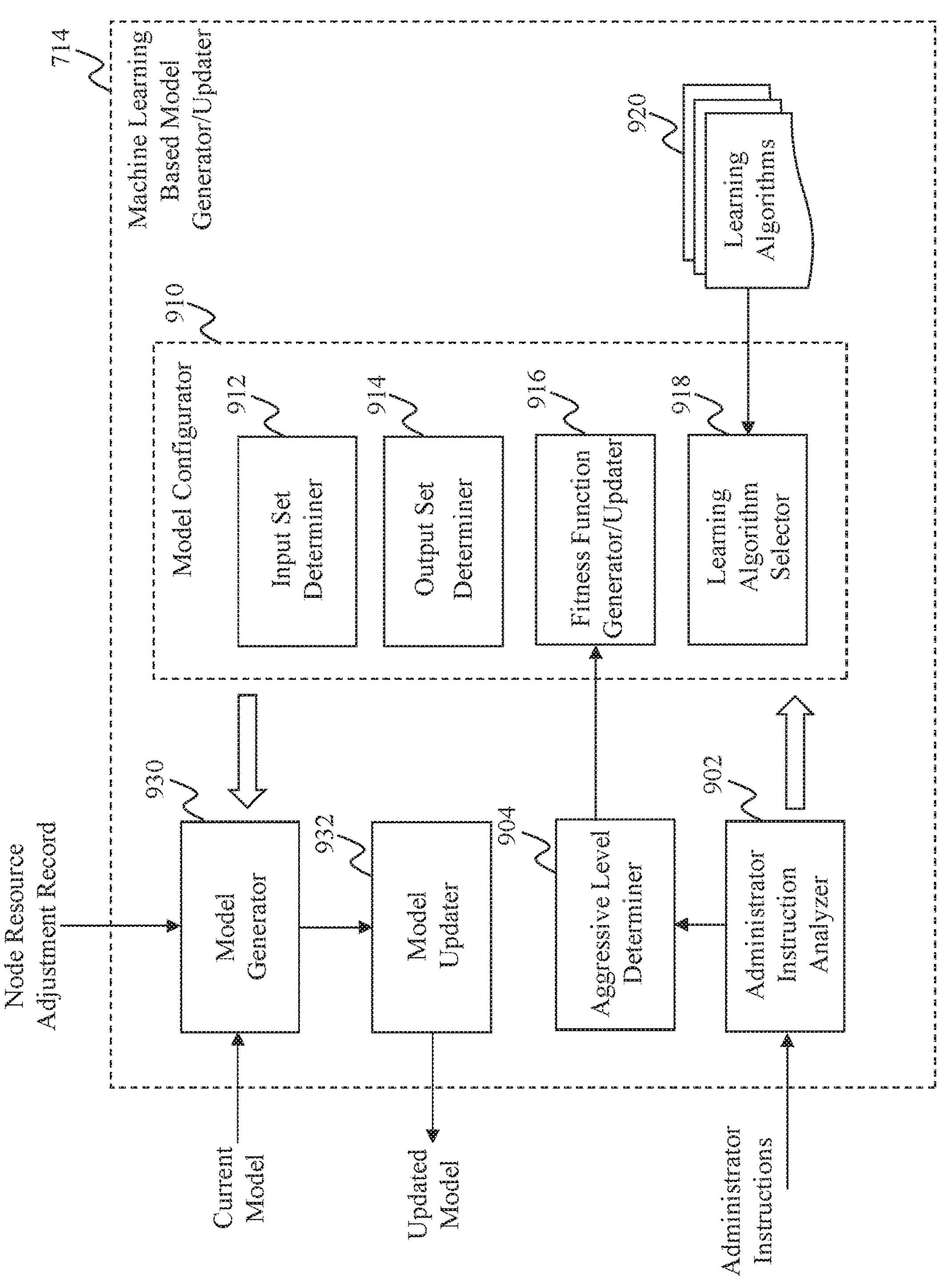
FIG. 9 illustrates an exemplary diagram of a machine learning based model generator/updater, according to an embodiment of the present teaching.

FIG. 9 illustrates an exemplary diagram of a machine learning based model generator/updater 714, according to an embodiment of the present teaching. As shown in FIG. 9, the machine learning based model generator/updater 714 in this example includes an administrator instruction analyzer 902, an aggressiveness determiner 904, a model configurator 910, one or more stored learning algorithms 920, a model generator 930, and a model updater 932.

The administrator instruction analyzer 902 in this example may receive and analyze an instruction from an administrator. The instruction may indicate that the administrator wants to update a resource adjustment model. In another embodiment, the administrator instruction analyzer 902 may receive a request from the timer 716 to update a resource adjustment model. Based on the instruction or request, the administrator instruction analyzer 902 may inform the aggressiveness determiner 904 to determine an aggressiveness score for the resource adjustment model, and send the analyzed instruction to the model configurator 910 for determining configurations for the model.

The aggressiveness determiner 904 in this example may receive the analyzed instruction from the administrator instruction analyzer 902 and determine aggressiveness score for resource adjustment model. On one hand, when the model is too aggressive, the model may cause a node to be assigned a job that it cannot handle, e.g. due to an increase of resource utilization by current running jobs. Then, the node needs to stop or hold one or more jobs, causing jobs lost on the node. On the other hand, when the model is not aggressive enough, the model may cause the node to be assigned a job with less size than it can handle, resulting in a waste of resources and low resource utilization on the node. In one embodiment, the aggressiveness determiner 904 may send the aggressiveness score to the model configurator 910, where the aggressiveness score may be utilized to generate or update a fitness function for training the model.

The model configurator 910 in this example may include an input set determiner 912, an output set determiner 914, a fitness function generator/updater 916, and a learning algorithm selector 918.

The input set determiner 912 may determine an input set for the machine learning model based on the analyzed instruction from the administrator instruction analyzer 902. For example, the input set may include ad related features, user related features, and other parameters that can be used as an input to the model. The input set determiner 912 may send the determined input set to the model generator 930 for generating a resource adjustment model based on simulations.

The output set determiner 914 may determine an output set for the machine learning model based on the analyzed instruction from the administrator instruction analyzer 902. For example, the output set may include adjusted available resource size and its associated confident score and associated aggressive level, and other parameters that can be used as an output from the model. The output set determiner 914 may send the determined output set to the model generator 930 for generating a resource adjustment model based on simulations.

The fitness function generator/updater 916 in this example may generate or update a fitness function based on the aggressive level determined at the aggressive level determiner 904. In one example, the fitness function may be represented by: Fitness Function=f(a)*R/L; where a represents an aggressive level for the resource adjustment model, f represents a function of the aggressive level, R represents a resource utilization rate on the node, and L represents a number of jobs lost on the node due to short of resource. It can be understood that other fitness functions can be used for training the model, so long as they can help to optimize resource utilization on the node. The fitness function generator/updater 916 may send the fitness function to the model generator 930 for generating a resource adjustment model based on simulations.

The learning algorithm selector 918 in this example may select one or more learning algorithms from the stored learning algorithms 920 for the model based on the analyzed instruction from the administrator instruction analyzer 902. The learning algorithm selector 918 may send the selected algorithms to the model generator 930 for generating a resource adjustment model based on simulations. For example, the model generator 930 may run parallel simulations based on these algorithms, score them and pick the best ones, e.g. the ten best algorithms. From the ten best algorithms, the model generator 930 can propagate more similar algorithms to be run again through parallel simulations. The process repeats until a good learning algorithm is determined at the model generator 930. In one example, a genetic algorithm like Neuro-Evolution of Augmenting Topologies (NEAT) may be selected as a good learning algorithm.

The model generator 930 in this example may receive all configurations, e.g. the input set, the output set, the fitness function, and the selected learning algorithms, from the model configurator 910. The model generator 930 may receive a current model and run simulations using the current model in accordance with the configurations. The simulations may be based on training data generated based on the node resource adjustment records sent by the node resource availability adjuster 710. The training data may also include simulated data that are related to node resource adjustment but are not from real past history. In particular, the model generator 930 may perform simulations with a simulated resource management engine and a simulated job scheduler, according to reinforcement learning. The model generator 930 can send the model simulation result to the model updater 932.

The model updater 932 in this example may generate an updated model based on the model simulation result from the model generator 930. The model updater 932 may update the current resource adjust model with the updated model.

Figure 10:
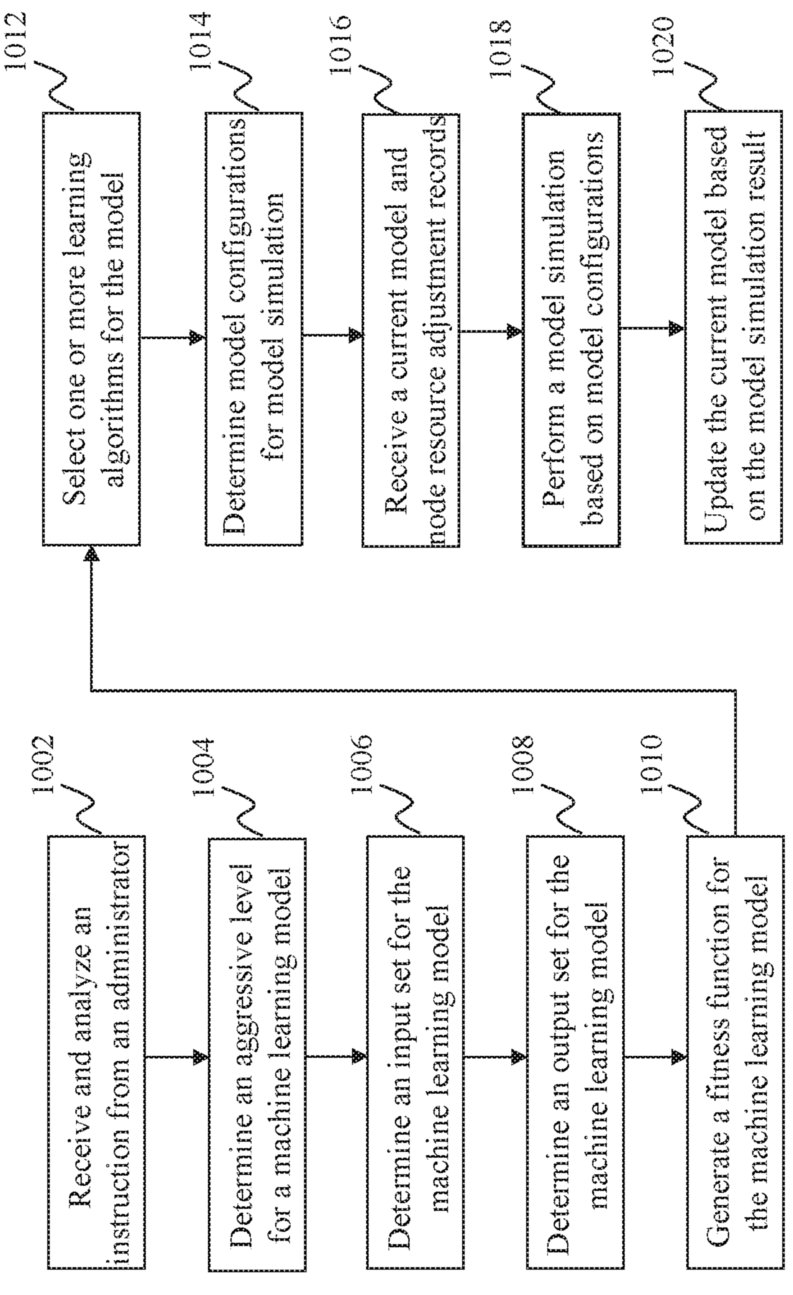
FIG. 10 is a flowchart of an exemplary process performed by a machine learning based model generator/updater, according to an embodiment of the present teaching.

FIG. 10 is a flowchart of an exemplary process performed by a machine learning based model generator/updater, e.g. the machine learning based model generator/updater 714 in FIG. 9, according to an embodiment of the present teaching. At 1002, an instruction is received from an administrator and analyzed. An aggressiveness score is determined at 1004 for a machine learning model, e.g. the resource adjustment model. An input set is determined at 1006 for the machine learning model. An output set is determined at 1008 for the machine learning model. A fitness function is generated or updated at 1010 for the machine learning model.

At 1012, one or more learning algorithms are selected for the model. Model configurations are determined at 1014 for model simulations. A current model and node resource adjustment records are received at 1016. A model simulation is performed at 1018 based on the model configurations. The current model is updated at 1020 based on the model simulation result.

Figure 11:
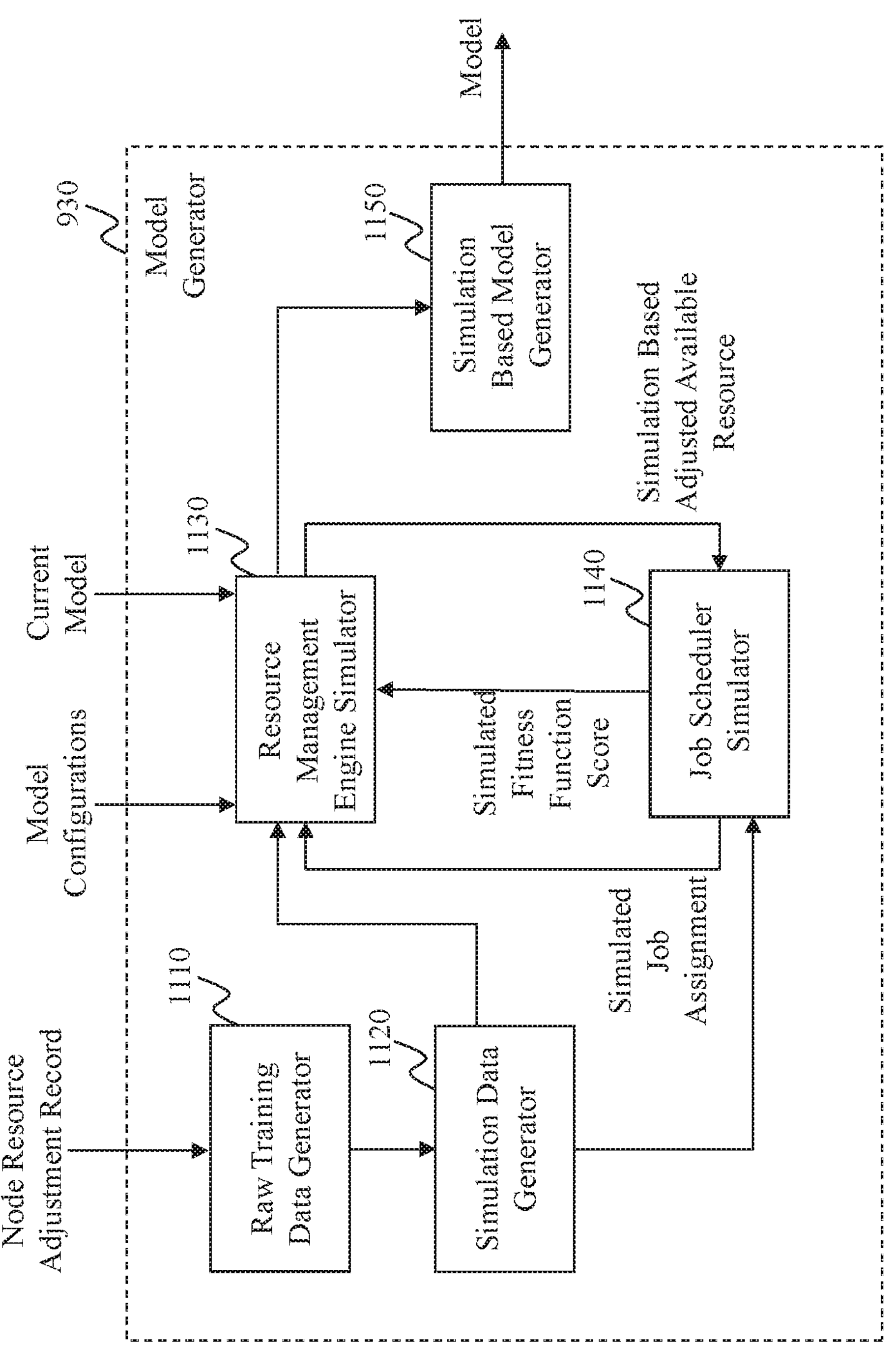
FIG. 11 illustrates an exemplary diagram of a model generator, according to an embodiment of the present teaching.

FIG. 11 illustrates an exemplary diagram of a model generator 930, according to an embodiment of the present teaching. As shown in FIG. 11, the model generator 930 in this example includes a raw training data generator 1110, a simulation data generator 1120, a resource management engine simulator 1130, a job scheduler simulator 1140, and a simulation based model generator 1150.

The raw training data generator 1110 in this example may receive node resource adjustment records from the node resource availability adjuster 710. The node resource adjustment records are records of real resource adjustments happened at the node resource availability adjuster 710. Based on the real records, the raw training data generator 1110 may generate raw training data for training the resource adjustment model. The raw training data generator 1110 may send the raw training data to the simulation data generator 1120 for generating simulated training data.

The simulation data generator 1120 in this example may receive raw training data from the raw training data generator 1110 and generate simulated training data based on the raw training data. In general, the simulated training data may be similar to the raw training data, but are not real records of resource adjustments and have a much larger size than the raw training data. With the simulated training data generated quickly at the simulation data generator 1120, the model generator 930 can train the model based on simulations without waiting for large real data from the node resource availability adjuster 710. The simulation data generator 1120 may send the simulated training data to the resource management engine simulator 1130 and to the job scheduler simulator 1140 for performing simulations based on the simulated training data. In one embodiment, the simulation data generator 1120 may also send the raw training data to the resource management engine simulator 1130 and the job scheduler simulator 1140, e.g. by including the raw training data into the simulated training data.

The resource management engine simulator 1130 in this example may receive model configurations from the model configurator 910 and obtain the current model from the stored resource adjustment models 712. Based on the current model, the resource management engine simulator 1130 and the job scheduler simulator 1140 may interact with each other to run simulations according to the model configurations. Like other reinforcement learning problem, the resource management engine simulator 1130 and the job scheduler simulator 1140 may interact to achieve a goal of optimizing resource utilization by maximizing a simulated fitness function score. Here, the resource management engine simulator 1130 serves as a learner or decision-maker or agent, while the job scheduler simulator 1140 serves as an environment.

During the reinforcement learning, at each time step, the resource management engine simulator 1130 may select and send actions, e.g. adjusted available resources, to the job scheduler simulator 1140, while the job scheduler simulator 1140 may respond to those actions and presents new situations, e.g. simulated job assignments, to the resource management engine simulator 1130. The job scheduler simulator 1140 also provides rewards, e.g. scores calculated based on the fitness function obtained from the model configurations, to the resource management engine simulator 1130 based on those actions. The rewards are what the resource management engine simulator 1130 tries to maximize over time. Aiming at maximizing the obtained scores, the resource management engine simulator 1130 can continuously modify the model for selecting each possible action, resulting in a good resource adjustment model to generate adjusted available resource sizes. According to a fitness function, the result resource adjustment model may optimize resource utilization on the node while minimizing cost due to jobs lost on the node.

The reinforcement learning may stop when one or more predetermined conditions are met, e.g. when the total rewards achieved by the resource management engine simulator 1130 are sufficient according to the administrator or another aspect of the system. Then, the resource management engine simulator 1130 may send the simulation result to the simulation based model generator 1150.

The simulation based model generator 1150 in this example may receive the simulation result from the resource management engine simulator 1130 and generate a simulation based model that can maximize the total amount of rewards the resource management engine simulator 1130 receives over the long run. The simulation based model generator 1150 may send the simulation based model for model update.

Figure 12:
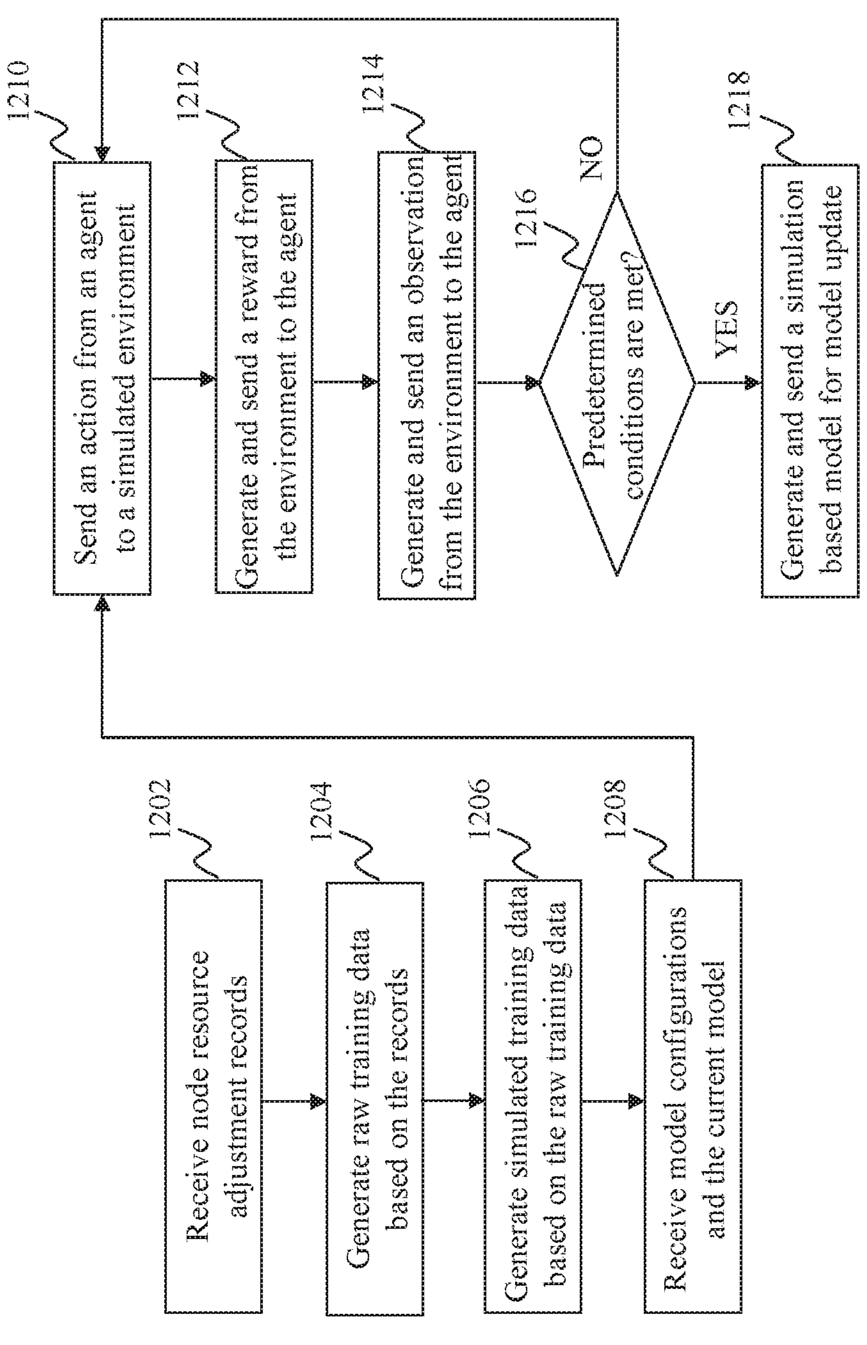
FIG. 12 is a flowchart of an exemplary process performed by a model generator, according to an embodiment of the present teaching.

FIG. 12 is a flowchart of an exemplary process performed by a model generator, e.g. the model generator 930 in FIG. 11, according to an embodiment of the present teaching. Node resource adjustment records are received at 1202. Raw training data are generated at 1204 based on the records. Simulated training data are generated at 1206 based on the raw training data. Model configurations and the current model are received at 1208.

An action from an agent, e.g. a simulated resource management engine, is sent at 1210 to a simulated environment, e.g. a simulated job scheduler. The action may be generated based on a model. A reward is generated and sent at 1212 from the environment to the agent. The reward may be a score that indicates a performance of a current version of the model. The model may be continuously updated based on previous rewards sent from the environment. At 1214, an observation, e.g. job assignment, is generated and sent from the environment to the agent. At 1216, it is determined when some predetermined conditions are met. If so, the process goes to 1218, where a simulation based model is generated and sent for model update. Otherwise, the process goes back to 1210, to continue send a next action from the agent to the environment.

It can be understood that the order of the steps shown in FIG. 6, FIG. 8, FIG. 10, and FIG. 12 may be changed according to different embodiments of the present teaching.

Figure 13:
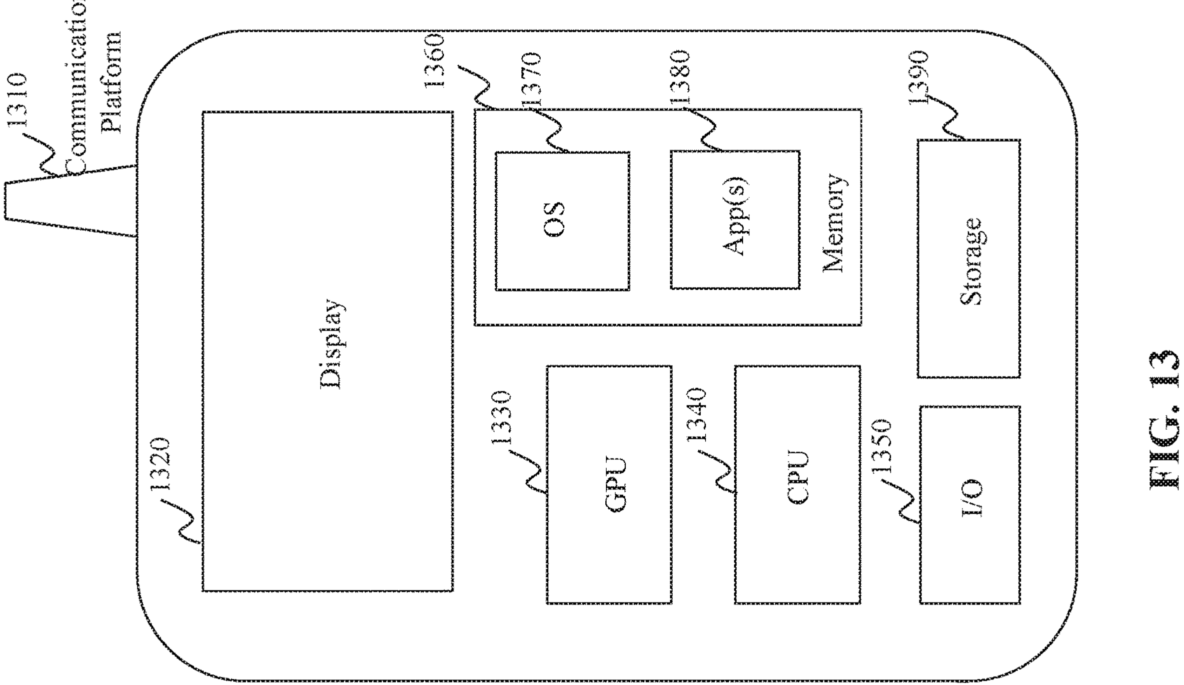
FIG. 13 depicts the architecture of a mobile device which can be used to implement a specialized system incorporating the present teaching.

FIG. 13 depicts the architecture of a mobile device which can be used to realize a specialized system implementing the present teaching. In this example, the operation node and/or the resource management engine 140 may be a mobile device 1300, including, but is not limited to, a smart phone, a tablet, a music player, a handled gaming console, a global positioning system (GPS) receiver, and a wearable computing device (e.g., eyeglasses, wrist watch, etc.), or in any other form factor. The mobile device 1300 in this example includes one or more central processing units (CPUs) 1340, one or more graphic processing units (GPUs) 1330, a display 1320, a memory 1360, a communication platform 1310, such as a wireless communication module, storage 1390, and one or more input/output (I/O) devices 1350. Any other suitable component, including but not limited to a system bus or a controller (not shown), may also be included in the mobile device 1300. As shown in FIG. 13, a mobile operating system 1370, e.g., IOS, Android, Windows Phone, etc., and one or more applications 1380 may be loaded into the memory 1360 from the storage 1390 in order to be executed by the CPU 1340. The applications 1380 may include a browser or any other suitable mobile apps for resource management on the mobile device 1300. User interactions with the device 1300 may be achieved via the I/O devices 1350.

To implement various modules, units, and their functionalities described in the present disclosure, computer hardware platforms may be used as the hardware platform(s) for one or more of the elements described herein (e.g., the operation node 110-1, the resource management engine 140, and/or other components of the systems 100 and 200 described with respect to FIGS. 1-12). The hardware elements, operating systems and programming languages of such computers are conventional in nature, and it is presumed that those skilled in the art are adequately familiar therewith to adapt those technologies to managing computing resource utilization based on reinforcement learning as described herein. A computer with user interface elements may be used to implement a personal computer (PC) or other type of work station or terminal device, although a computer may also act as a server if appropriately programmed. It is believed that those skilled in the art are familiar with the structure, programming and general operation of such computer equipment and as a result the drawings should be self-explanatory.

Figure 14:
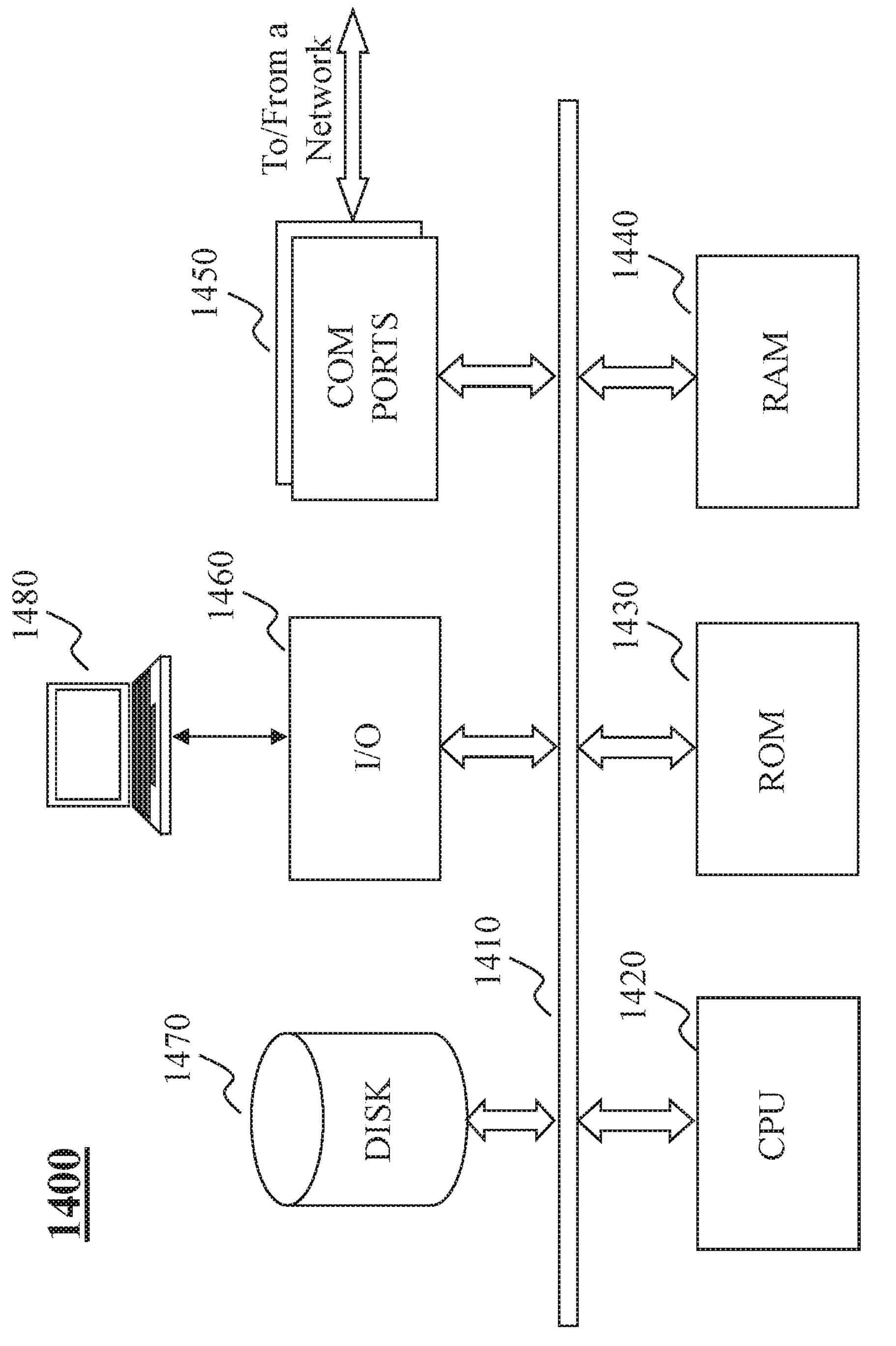
FIG. 14 depicts the architecture of a computer which can be used to implement a specialized system incorporating the present teaching.

FIG. 14 depicts the architecture of a computing device which can be used to realize a specialized system implementing the present teaching. Such a specialized system incorporating the present teaching has a functional block diagram illustration of a hardware platform which includes user interface elements. The computer may be a general purpose computer or a special purpose computer. Both can be used to implement a specialized system for the present teaching. This computer 1400 may be used to implement any component of the techniques about managing computing resource utilization based on reinforcement learning, as described herein. For example, the operation node 110-1, the resource management engine 140, etc., may be implemented on a computer such as computer 1400, via its hardware, software program, firmware, or a combination thereof. Although only one such computer is shown, for convenience, the computer functions relating to managing computing resource utilization based on reinforcement learning as described herein may be implemented in a distributed fashion on a number of similar platforms, to distribute the processing load.

The computer 1400, for example, includes COM ports 1450 connected to and from a network connected thereto to facilitate data communications. The computer 1400 also includes a central processing unit (CPU) 1420, in the form of one or more processors, for executing program instructions. The exemplary computer platform includes an internal communication bus 1410, program storage and data storage of different forms, e.g., disk 1470, read only memory (ROM) 1430, or random access memory (RAM) 1440, for various data files to be processed and/or communicated by the computer, as well as possibly program instructions to be executed by the CPU. The computer 1400 also includes an I/O component 1460, supporting input/output flows between the computer and other components therein such as user interface elements 1480. The computer 1400 may also receive programming and data via network communications.

Hence, aspects of the methods of managing computing resource utilization based on reinforcement learning, as outlined above, may be embodied in programming. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives and the like, which may provide storage at any time for the software programming.

All or portions of the software may at times be communicated through a network such as the Internet or various other telecommunication networks. Such communications, for example, may enable loading of the software from one computer or processor into another, for example, from one device into the hardware platform(s) of a computing environment or other system implementing a computing environment or similar functionalities in connection with techniques of managing computing resource utilization based on reinforcement learning. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible "storage" media, terms such as computer or machine "readable medium" refer to any medium that participates in providing instructions to a processor for execution.

Hence, a machine-readable medium may take many forms, including but not limited to, a tangible storage medium, a carrier wave medium or physical transmission medium. Non-volatile storage media include, for example, optical or magnetic disks, such as any of the storage devices in any computer(s) or the like, which may be used to implement the system or any of its components as shown in the drawings. Volatile storage media include dynamic memory, such as a main memory of such a computer platform. Tangible transmission media include coaxial cables; copper wire and fiber optics, including the wires that form a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a physical processor for execution.

Those skilled in the art will recognize that the present teachings are amenable to a variety of modifications and/or enhancements. For example, although the implementation of various components described above may be embodied in a hardware device, it may also be implemented as a software only solution—e.g., an installation on an existing server. In addition, the managing computing resource utilization based on reinforcement learning as disclosed herein may be implemented as a firmware, firmware/software combination, firmware/hardware combination, or a hardware/firmware/software combination.

While the foregoing has described what are considered to constitute the present teachings and/or other examples, it is understood that various modifications may be made thereto and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

We claim:

1. A method for managing computing resources, the method comprising:

running, by a computing node, a first job;

sending, to a resource management engine, container information about a container in the computing node for running the first job, wherein the container information indicates a maximum usage of the container, a minimum usage of the container, an average usage of the container, and a current usage of the container;

determining current available computing resources on the computing node based on the container information and historical information indicating past available computing resources on the computing node; and receiving, from a job scheduler distinct from the resource management engine, a second job to be launched on the computing node, wherein the second job is determined by the job scheduler based on an adjusted available computing resources for the computing node to be assigned with a new job, the adjusted available computing resources are determined by the resource management engine according to a machine-trained model for adjusting the current available computing resources to become the adjusted available computing resources of the computing node in assigning a new job to the computing node to handle, and the job scheduler that assigns jobs has no knowledge that the current available computing resources have been adjusted by the resource management engine to become the adjusted available computing sources.

2. The method of claim 1, wherein the container comprises a reserved space on the computing node for running the first job.

3. The method of claim 1, further comprising:

generating a new container to run the second job.

4. The method of claim 1, wherein the machine-trained model is trained based on training data generated via simulation based on raw training data associated with records of previous resource adjustments with respect to the computing node.

5. The method of claim 1, wherein the machine-trained model is trained based on an aggressiveness score with values indicative of aggressiveness of the machine-trained model in controlling adjusting the available computing resource of the computing node in assigning a job to the computing node to handle.

6. The method of claim 5, wherein the aggressiveness indicates whether the machine-trained model causes loss of jobs at the computing node or waste of computing resources at the computing node.

7. The method of claim 1, wherein the machine-trained model is trained by maximizing a score associated with a fitness function of the machine-trained model.

8. A non-transitory, computer-readable medium having information recorded thereon for managing computing resources, when read by at least one processor, effectuate operations comprising:

running, by a computing node, a first job;

sending, to a resource management, container information about a container in the computing node for running the first job, wherein the container information indicates a maximum usage of the container, a minimum usage of the container, an average usage of the container, and a current usage of the container;

determining current available computing resources on the computing node based on the container information and historical information indicating past available computing resources on the computing node; and receiving, from a job scheduler distinct from the resource management engine, a second job to be launched on the computing node, wherein the second job is determined by the job scheduler based on an adjusted available computing resources for the computing node to be assigned with a new job, the adjusted available computing resources are determined by the resource management engine according to a machine-trained model for adjusting the current available computing resources to become the adjusted adjusting available computing resources of the computing node in assigning a new job to the computing node to handle, and the job scheduler that assigns jobs has no knowledge that the current available computing resources have been adjusted by the resource management engine to become the adjusted available computing sources.

9. The medium of claim 8, wherein the container comprises a reserved space on the computing node for running the first job.

10. The medium of claim 8, wherein the operations further comprise:

generating a new container to run the second job.

11. The medium of claim 8, wherein the machine-trained model is trained based on training data generated via simulation based on raw training data associated with records of previous resource adjustments with respect to the computing node.

12. The medium of claim 8, wherein the machine-trained model is trained based on an aggressiveness score with values indicative of aggressiveness of the machine-trained model in controlling adjusting the available computing resource of the computing node in assigning a job to the computing node to handle.

13. The medium of claim 12, wherein the aggressiveness indicates whether the machine-trained model causes loss of jobs at the computing node or waste of computing resources at the computing node.

14. The medium of claim 8, wherein the machine-trained model is trained by maximizing a score associated with a fitness function of the machine-trained model.

15. A system for managing computing resources, the system comprising:

memory storing computer program instructions; and one or more processors that, in response to executing the computer program instructions, effectuate operations comprising:

running, by a computing node, a first job;

sending, to a resource management engine, container information about a container in the computing node for running the first job, wherein the container information indicates a maximum usage of the container, a minimum usage of the container, an average usage of the container, and a current usage of the container;

determining current available computing resources on the computing node based on the container information and historical information indicating past available computing resources on the computing node; and receiving, from a job scheduler distinct from the resource management engine, a second job to be launched on the computing node, wherein the second job is determined by the job scheduler based on an adjusted available computing resources for the computing node to be assigned with a new job, the adjusted available computing resources are determined by the resource management engine according to a machine-trained model for adjusting the current available computing resources to become the adjusted adjusting available computing resources of the computing node in assigning a new job to the computing node to handle, and the job scheduler that assigns jobs has no knowledge that the current available computing resources have been adjusted by the resource management engine to become the adjusted available computing sources.

16. The system of claim 15, wherein the container comprises a reserved space on the computing node for running the first job.

17. The system of claim 15, wherein the operations further comprise:

generating a new container to run the second job.

18. The system of claim 15, wherein the machine-trained model is trained based on training data generated via simulation based on raw training data associated with records of previous resource adjustments with respect to the computing node.

19. The system of claim 15, wherein the machine-trained model is trained based on an aggressiveness score with values indicative of aggressiveness of the machine-trained model in controlling adjusting the available computing resource of the computing node in assigning a job to the computing node to handle.

20. The system of claim 19, wherein the aggressiveness indicates whether the machine-trained model causes loss of jobs at the computing node or waste of computing resources at the computing node.

* * * * *